US010854719B2

(12) United States Patent
Raghavan et al.

(10) Patent No.: US 10,854,719 B2
(45) Date of Patent: Dec. 1, 2020

(54) PLATFORM OF LARGE METAL NITRIDE ISLANDS WITH LATERAL ORIENTATIONS AND LOW-DEFECT DENSITY

(71) Applicant: INDIAN INSTITUTE OF SCIENCE, Bangalore (IN)

(72) Inventors: Srinivasan Raghavan, Bangalore (IN); Hareesh Chandrasekar, Bangalore (IN); Nagaboopathy Mohan, Bangalore (IN); Dhayalan Shakthivel, Bangalore (IN)

(73) Assignee: Indian Institute of Science, Bangalore (IN)

( * ) Notice: Subject to any disclaimer, the term of this patent is extended or adjusted under 35 U.S.C. 154(b) by 0 days.

(21) Appl. No.: 15/462,294

(22) Filed: Mar. 17, 2017

(65) Prior Publication Data

US 2017/0278932 A1    Sep. 28, 2017

(30) Foreign Application Priority Data

Mar. 22, 2016    (IN) .............................. 201641010055

(51) Int. Cl.
*H01L 29/20*    (2006.01)
*H01L 21/02*    (2006.01)
(Continued)

(52) U.S. Cl.
CPC .......... *H01L 29/2003* (2013.01); *C30B 25/04* (2013.01); *C30B 25/186* (2013.01); *C30B 29/406* (2013.01); *C30B 29/605* (2013.01); *H01L 21/0242* (2013.01); *H01L 21/0254* (2013.01); *H01L 21/02433* (2013.01);
(Continued)

(58) Field of Classification Search
CPC ............... H01L 29/2003; H01L 29/045; H01L 29/1608; H01L 29/04; H01L 29/30; H01L 29/12; H01L 21/02365; H01L 21/02433; H01L 21/76876; H01L 33/005; H01L 33/0075

See application file for complete search history.

(56) References Cited

U.S. PATENT DOCUMENTS 6,858,081 B2 * 2/2005 Biwa ....................... C30B 25/02
117/102
2006/0273343 A1 * 12/2006 Nakahata ................ C30B 25/02
257/103

(Continued)

*Primary Examiner* — Galina G Yushina
(74) *Attorney, Agent, or Firm* — Muncy, Geissler, Olds & Lowe, P.C.

(57) ABSTRACT

The present invention provides a metal nitride platform for semiconductor devices, including, a pre-defined array of catalyst sites, disposed on a substrate. Metal nitride islands with lateral to vertical size ratios of at least greater than one (1) are disposed on the array of catalyst sites, where the surfaces of the metal nitride islands are with reduced dislocation densities and side walls with bending of dislocations. The platform of metal nitride islands is further used to build electrically and optically-active devices. The present invention also provides a process for the preparation of a metal nitride platform, selectively, on the array of catalyst sites, in the presence of a reactive gas and precursors and under preferred reaction conditions, to grow metal nitride islands with lateral to vertical size ratios of at least greater than one (1).

13 Claims, 6 Drawing Sheets (51) Int. Cl.
    *H01L 21/768* (2006.01)
    *H01L 29/04* (2006.01)
    *H01L 29/16* (2006.01)
    *C30B 25/18* (2006.01)
    *C30B 25/04* (2006.01)
    *C30B 29/40* (2006.01)
    *C30B 29/60* (2006.01)

(52) U.S. Cl.
    CPC .. *H01L 21/02458* (2013.01); *H01L 21/02645* (2013.01); *H01L 21/02653* (2013.01); *H01L 21/76871* (2013.01); *H01L 29/1608* (2013.01); *H01L 29/045* (2013.01)

(56) References Cited

U.S. PATENT DOCUMENTS

| | | | | |
|---|---|---|---|---|
| 2008/0308841 | A1* | 12/2008 | Odnoblyudov | H01L 21/0242 257/190 |
| 2009/0098343 | A1* | 4/2009 | Arena | H01L 21/0254 428/172 |
| 2011/0012109 | A1* | 1/2011 | Kryliouk | H01L 21/02433 257/49 |
| 2012/0187443 | A1* | 7/2012 | Tsang | H01L 21/0237 257/99 |
| 2014/0054605 | A1* | 2/2014 | Iwai | H01L 33/007 257/76 |

* cited by examiner

PLATFORM OF LARGE METAL NITRIDE ISLANDS WITH LATERAL ORIENTATIONS AND LOW-DEFECT DENSITY

TECHNICAL FIELD

The present invention relates to a platform of large metal nitride islands that are laterally-oriented with respect to a crystallographic template substrate and with low-defect density. The present invention also relates to a process for a single-step preferential nucleation and growth of defect-free platform of large metal nitride islands, with lateral orientations.

BACKGROUND OF THE INVENTION

Group III nitrides that are made up of nitrides of aluminum (AlN), gallium (GaN) and indium (InN) and their alloys are used in a number of semiconductor devices. The usefulness of gallium nitride (GaN) and its ternary and quaternary compounds incorporating aluminum and indium (AlGaN, InGaN, AlInGaN) has been well established for the fabrication of visible and ultraviolet optoelectronic devices, high-frequency devices and high-power electronic devices. These devices are typically grown epitaxially by techniques including molecular beam epitaxy (MBE), metal-organic chemical vapor deposition (MOCVD), or hydride vapor phase epitaxy (HVPE).

However, the growth of Group III-A nitrides, is typically performed on foreign substrates, such as sapphire, silicon carbide and silicon, primarily due to the lack of large-area single crystal substrates of gallium nitride (GaN) or aluminum nitride (AlN) (<2 inch diameter) and their expensive cost. This normally leads to very high defect densities (mostly in the form of dislocations) in the as-grown films due to the lattice mismatch and thermal mismatch between the nitride thin films and the substrates, and in extreme cases due to film de-lamination and cracking.

In order to manage these stresses and reduce defects, in a typical top-down process, buffer layers with spatially varying compositions are used, on which layers constituting the active device are then deposited. The devices themselves occupy small regions over the entire wafer, and are patterned using known lithographic techniques, while the rest of the material across the substrate/wafer constitutes a mechanical and thermal support. Whereas, a bottom-up approach to fabricating devices would, on the other hand, involve material growth only at the areas on the substrate where the devices are desired, which would in turn give rise to significant material savings. While this can be achieved by using techniques such as the vapor-liquid-solid method which is used to grow nanowires at pre-selected locations, the material thus grown is typically very small in size, tens or hundreds of nanometers in lateral dimensions, and hence impose severe restrictions on the device areas that can be realized. Furthermore, the high aspect ratio of such structures (vertical:lateral sizes) also precludes the possibility of planar processing which is the mainstay of the semiconductor industry.

Hence, there is a pressing need to develop bottom-up fabrication techniques to grow nitrides of device with relevant dimensions, at pre-patterned locations and over large-areas on a substrate.

The typical dislocation densities for growth of nitride thin films on sapphire, SiC and Si are $10^8$ cm$^{-2}$, $10^8$-$10^9$ cm$^{-2}$ and $10^9$ cm$^{-2}$, respectively. The need to reduce the defect densities is critical to improve the performance and reliability of devices made of these materials. Defect reduction schemes such as lateral epitaxial overgrowth or pendeo-epitaxy are employed, which can bring down the defect density selectively to $10^6$ cm$^{-2}$ but with added process complexities. These schemes typically involve multiple lithography steps with interruption of the growth process in between to realize "pockets" of these low defect density structures, which are then used to fabricate devices. In addition, in these methods there is also a need to use a mask layer with openings. In such methods, limited areas of the defect-free material growth are obtained, with the material growth happening all over the substrate, in an uncontrolled manner. Therefore, there is a need to reduce defect density in hetero-epitaxial nitride thin films over larger areas.

Nanostructuring offers a way to reduce defect densities in metal nitride structures, where nanowires of GaN and other semiconductors have been grown with near perfect crystallinity on foreign substrates.

The vapor-liquid-solid method (VLS) is a mechanism for the growth of one-dimensional structures, such as nanowires, from chemical vapor deposition. In VLS method, a metal particle, which is used as a seed, having catalytic properties, is heated in an environment containing vapors of gaseous precursor molecules. Due to heating, a eutectic melt between the precursor species and the metal catalyst is formed in the seed particle. When the material in the seed particle reaches a critical saturation concentration, it precipitates out of the seed particle in a given crystallographic orientation. In case, the gaseous precursor is replaced with a liquid phase precursor, the method is then called Liquid-Liquid-Solid (LLS) technique. The other related methods of VLS include vapour-solid-solid (VSS) and liquid-solid-solid (LSS) where the catalyst remains a solid instead of forming a eutectic liquid phase.

The use of bottom-up techniques such as the vapour-liquid-solid (VLS) technique, allows for precise selectivity and control over the location of growth of these nanowires with limited deposition at other locations thus saving on material costs. However, the limited area of these devices and their large aspect ratio, precludes the possibility of planar processing of semiconductor devices, which is essential for their integration with existing semiconductor process flows.

In a known vapor-liquid-solid (VLS) technique, the size of the catalysts, which are used for the growth of metal nitride structures, is typically less than one micron and the corresponding metal nitride growth structures also correspond to the size of the catalyst.

In a known lateral epitaxial growth of metal nitride layers, mask layers are used with pre-defined openings, for defect density reduction, even though the presence of mask layers have no other significant functional attributes. Additionally, the growth process needs to be interrupted in order to remove the sample from the growth chamber, followed by patterning the mask layer using at least one lithographic step. The sample is then reloaded into the growth chamber and further deposition is initiated, which results in areas of low defect density material obtained over the masked regions. Such growth interruptions give rise to a large process turnaround time and the interface between the material deposited in the first and second growth steps is not atomically pristine as the surface is exposed to atmospheric contaminants upon removal from the growth chamber.

In consideration of the above, there is a need to provide a structure with large lateral areas of metal nitride layers, with reduced dislocation densities and a process for preparing such structures, which does not have the limitations of methods such as VLS, lateral epitaxial overgrowth (LEO) and where mask layers are used during the growth of structures.

OBJECTS OF THE PRESENT INVENTION

The primary object of the present invention is to provide a platform of large metal nitride islands that are selectively grown from an array of catalyst sites of a substrate with a crystallographic surface orientation and where the lateral dimensions of the metal nitride islands are larger than the dimensions of the catalyst sites.

An object of the present invention is to provide a platform of large metal nitride islands that are grown selective from an array of catalyst sites of a substrate having a crystallographic surface orientation, where the array of catalyst sites is formed with a single type of catalyst material or different types of catalyst materials.

Another object of the present invention to provide a platform of large metal nitride islands that are grown selectively from an array of catalyst sites of a substrate on which an electrically and optically-active device is arranged.

It is also an object of the present invention to provide a process for a single-step preferential nucleation and growth of defect-free platform of large metal nitride islands, without using a mask.

Yet another object of the present invention is to provide a process for a single-step material growth for fabricating a platform for the growth of metal nitride islands that are laterally-oriented with respect to a crystallographic template substrate and with a low-defect density, where the integration of the platform with the devices, is performed in a single lithography step, at an initial stage and without any further growth interruption.

These and the other objects and the appurtenant advantages of the embodiments herein will be understood easily by studying the following specification with the accompanying drawings.

BRIEF DESCRIPTION OF THE DRAWINGS

The accompanying drawings illustrate various exemplary embodiments of the invention. It will be appreciated that illustrated element boundaries, for instance shapes and lines in the drawings, represent an exemplary instances of the boundaries.

SUMMARY OF THE INVENTION

The present invention provides a metal nitride platform for semiconductor devices, comprising, a pre-defined array of catalyst sites, disposed on a substrate. The metal nitride islands with lateral to vertical size ratios of at least greater than one (1) are disposed on the array of catalyst sites, where the surfaces of the metal nitride islands are with reduced dislocation densities and side walls with bending of dislocations. The platform of metal nitride islands is further used to build electrically and optically-active devices. The present invention also provides a process the preparation of a metal nitride platform, selectively, on the array of catalyst sites, in the presence of a reactive gas and precursors and under preferred reaction conditions, to grow metal nitride islands with lateral to vertical size ratios of at least greater than one (1).

DETAILED DESCRIPTION OF THE INVENTION

Accordingly, the present invention provides a platform with an array of catalyst sites incorporated on a crystallographic template substrate, to bear metal nitride islands, where the lateral dimensions of the metal nitride islands are larger than the dimensions of the catalyst sites.

In the present invention, as an exemplary aspect, growth of metal nitride islands with reduced dislocation density on a substrate, where the lateral dimensions of the metal nitride islands are larger than the dimensions of the catalyst sites, is demonstrated with c-plane polar orientation. However, it is understood that by changing the orientation of the substrate, the growth of metal nitrides can be performed on non-polar oriented substrates, with reduced dislocation density.

In an aspect of the present invention, catalyst sites, which are lithographically defined on a selected substrate, are used to obtain site-selective nuclei, which then act as focal sites, for enhancing the lateral growth of metal nitride islands, from these catalyst sites.

Figure 1:
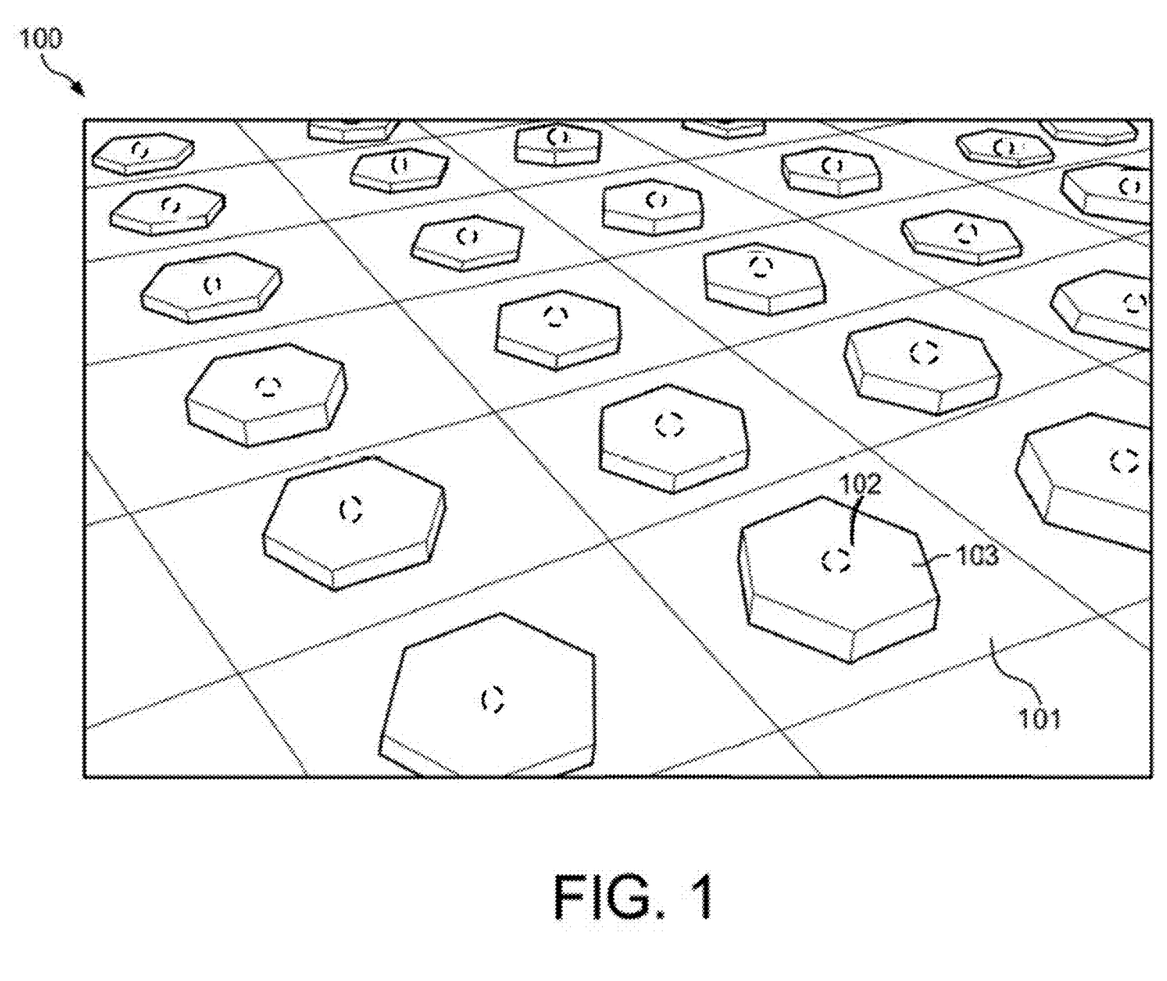
FIG. 1 is a schematic drawing depicting lateral orientation of exemplary gallium nitride islands, grown on a substrate, through an array of catalyst sites with typical sizes less than 1 μm and catalyst site separation distance of more than 1 μm.

As initially presented in FIG. 1, the platform 100 includes a substrate 101, which is typically sapphire, silicon, silicon carbide. The selected substrate 101 can be of any suitable size, preferably in the range of 2 to 12 inches and more preferably in the range of 4 to 8 inches and with a thickness in the range of 100 microns-2 mm. The crystal orientations of a preferred silicon substrate are (100), (111), (110) and whereas the crystal orientations of a preferred silicon carbide substrate are (4H), (6H), (3C). The preferred sapphire substrate is with c-plane, r-plane, a-plane or m-plane orientations.

A pre-defined array of catalyst sites 102 is arranged on the selected substrate 101. The catalyst sites 102 are formed from materials such as gold, nickel or a layered material, preferably graphene, molybdenum disulphide ($MoS_2$) or tungsten disulphide ($WS_2$) or a combination of these materials. The catalyst sites 102 are advantageously arranged lithographically on the substrate 101, considering the required dimensions of the semiconductor devices, that are to be built on these catalyst sites 102. The size of an individual catalyst site is smaller in dimension, than preferably about 1 micron. The smaller size of the catalyst site, supports much larger lateral growth of metal nitride islands, even without increasing the size of the catalyst site. In this aspect, it also understood that in the pre-defined array of catalyst sites 102, the separation between each of the catalyst sites can be suitably varied to suit the size of the desired semiconductor device. The catalyst sites 102 are employed to merely obtain site-selective nuclei, which then act as focal sites for enhancing the lateral growth of metal nitride islands 103 as illustratively shown in FIG. 2, where the sizes of the catalyst sites 102 are relatively smaller than the metal nitride islands 103, indicating the enhancement of the lateral dimension of the metal nitride islands 103 as compared to the size of the catalyst sites 102. The material for the array of catalyst sites 102 is selected from a metal, preferably gold, nickel or a layered material such as graphene, molybdenum disulphide ($MoS_2$) or tungsten disulphide ($WS_2$), or a combination of these materials.

Figure 7:
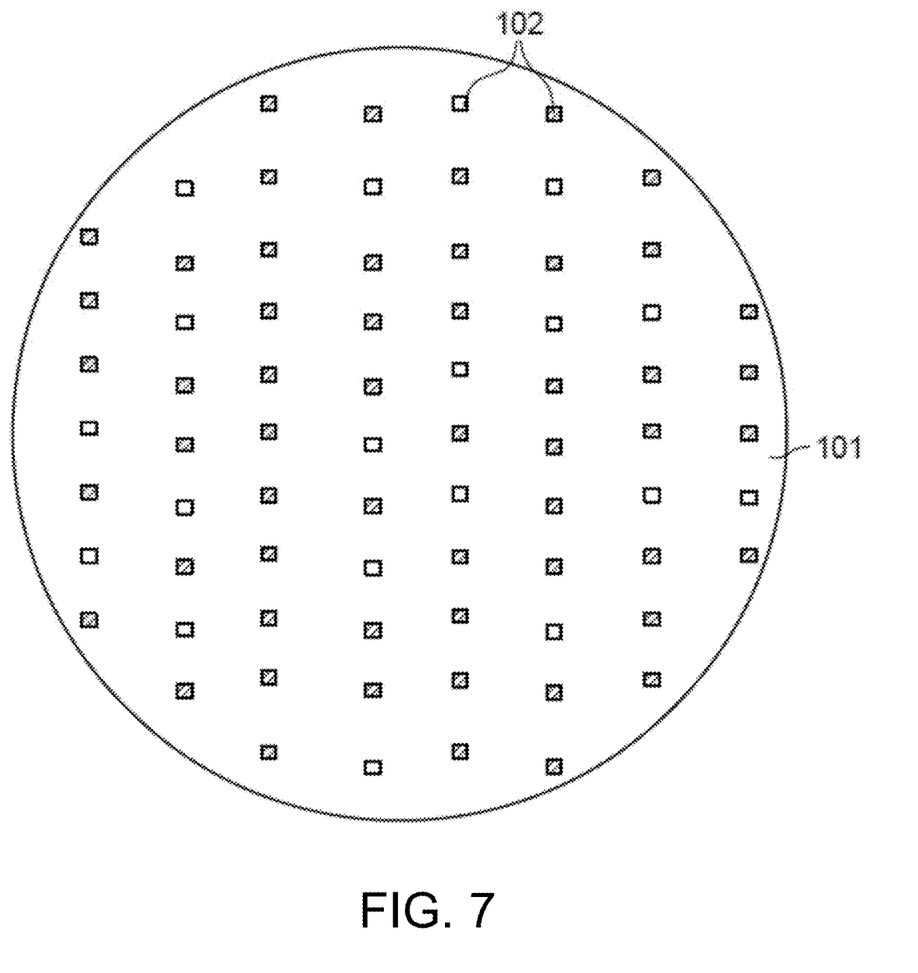
FIG. 7 is a schematic depiction of the presence of different catalyst materials on the same substrate at pre-defined locations, which can be used to grow low-defect density islands of varying compositions and orientations.

In another aspect of the present invention, the array of catalyst sites 102 is formed with a single type of material. However, it is within the purview of this invention to form an array of catalysts sites by using more than one type of desired materials as particularly shown in FIG. 7. Such an arrangement of catalyst sites 102 with more than one type of metallic materials facilitate the growth of metal nitride islands of different compositions under each type of catalyst size. For instance, in case of two catalysts with different types of metallic materials, the composition of metal nitride islands 103 thus obtained under each type of catalyst are based on the general formula $Al_xGa_yIn_{1-x-y}N$ and $Al_pGa_qIn_{1-p-q}N$ where $p \neq x$ and $q \neq y$, where the actual values of p, q, x and y are determined by the incorporation of the precursors into the metal catalysts.

Figure 4:
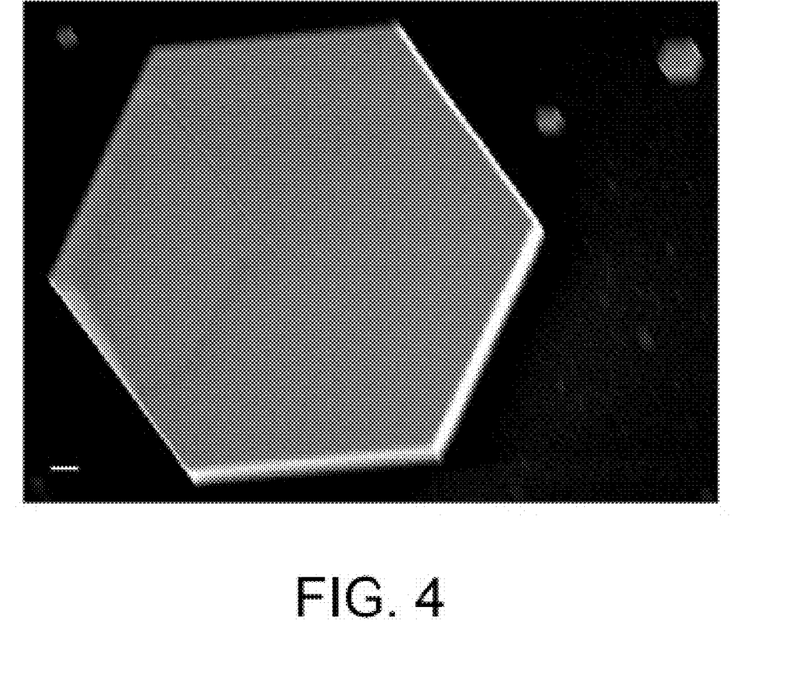
FIG. 4 is a scanning electron microscope (SEM) image of an exemplary GaN island that is laterally grown on sapphire c-plane substrate through an array of catalyst sites.
Figure 5:
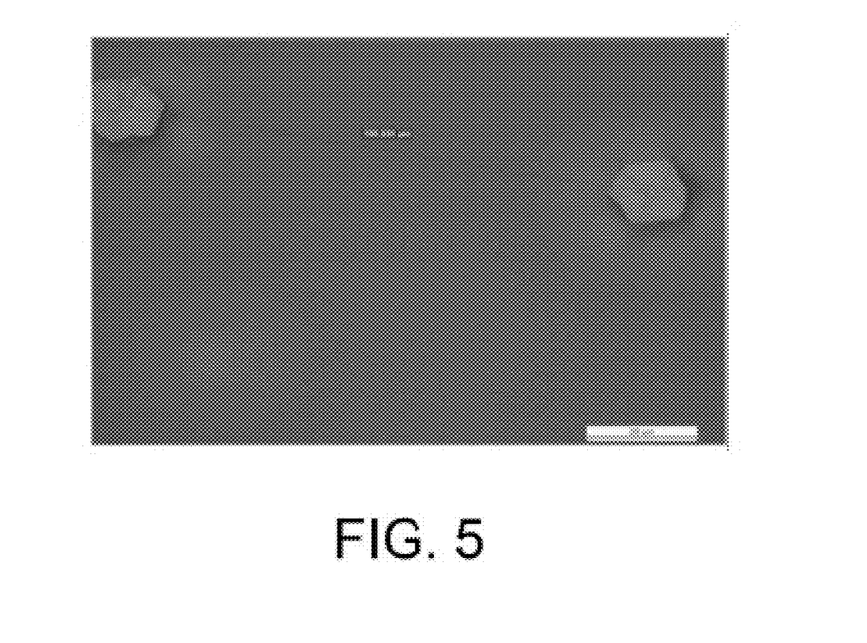
FIG. 5 is an optical micrograph of two exemplary hexagonal single crystal gallium nitride islands as part of an array grown on a sapphire substrate.

The metal nitride islands 103 with variable lateral dimensions that are larger than the dimensions of the catalyst sites 102, are grown on the array of catalyst sites 102. The material for the metal nitride island 103 that is grown on the catalyst sites 102 is selected from gallium nitride (GaN), aluminum nitride (AlN), indium nitride (InN) or a combination of any these metal nitrides. The lateral growth of the metal nitride islands 103 is achieved by confining the selectivity of the metal nitride island to the catalyst site 102, which is followed by their enhanced lateral growth, to render large-area metal nitride islands 103. The lateral dimensions of the metal nitride islands 103 are preferably in the range of 1 micron to 1 mm with the sizes and spacings determined by the area of the device required to be fabricated. An exemplary metal nitride island having a maximum lateral dimension of 20 microns is shown in FIGS. 4 and 5 with the spacing that is provided between the islands is about 100 microns. The variations in the lateral growth of the metal nitride islands 103 can be achieved by varying the growth time and process parameters such as temperature, pressure, flow rates and V/III ratios. It is understood here that the size of these islands 103 can also be suitably increased beyond this preferable range.

Figure 3A:
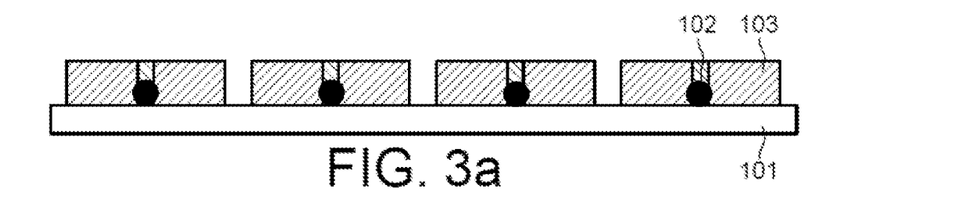
FIG. 3(a) is a schematic cross-sectional view depicting lateral orientation of exemplary gallium nitride islands, grown on a substrate, through an array of catalyst sites, with reduced dislocation density.

The metal nitride islands 103 either incorporate the catalyst particles 102 within their thickness as shown in FIG. 3(*a*) or at their surface as shown in FIG. 1. Such incorporation is dependent on the choice of the catalyst, the metal nitride to be grown and process parameters used for the deposition. The laterally-grown metal nitride islands 103 are in the form of a single domain with all regions of a given metal nitride islands 103 being oriented in one particular orientation with reference to the substrate 101. The ratio of the lateral dimension of the metal nitride islands 103 and the size of catalyst site 102 is at least in the range of 10:1 with the lateral dimension of the required device determining the size of the final metal nitride islands. However, the size of the catalyst sites, is advantageously retained at <1 µm.

The laterally-grown metal nitride islands 103 are controlled precisely, where such precise control refers to obtaining the metal nitride islands 103 centered only at the catalyst sites 102, with the lateral and vertical dimensions of the said metal nitride islands 103 are precisely determined by the growth time and process parameters such as temperature, pressure, flow rate and V/III ratio.

Figure 6:
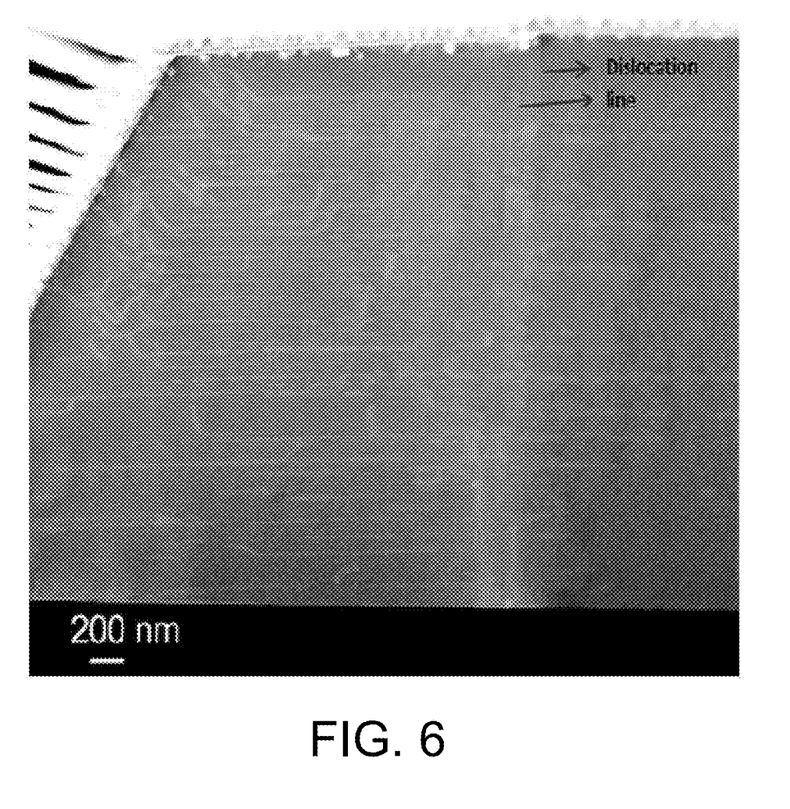
FIG. 6 is a cross-sectional scanning transmission electron microscope image of the as-grown gallium nitride island.

The surfaces 103*a* of the metal nitride islands 103 exhibit substantially low defects, where dislocations originating from the lower portions, thread through vertically, to reach the surfaces 103*a* of the metal nitride islands 103. Concurrently, the dislocations, which encounter the side walls 103*b* of the metal nitride islands 103, undergo lateral deviations, instead of extending vertically, which shows the bending of those dislocations that encounter the side facets and whereas those dislocations encountering the top surface thread through to higher thicknesses. Accordingly, the dislocation density of the metal nitride island 103 is substantially reduced at the surface 103*a*, by virtue of deviation of the dislocations laterally. In an embodiment of the present invention, the reduced dislocation density on the surfaces 103*a* of the metal nitride islands 103 is equal to or less than $10^6/cm^2$. The exemplary GaN islands with reduced dislocation density is as shown in FIG. 6, which is a cross sectional TEM image, where the dislocation density at the surface is practically zero as can be seen from the presence of only two dislocation lines intersecting the surface over the entire island image. The bending of the dislocations encounter the side walls of the growing island.

In another aspect of the present invention, the metal nitride islands 103 are grown in the absence of any masking materials such as silicon nitride, silicon oxide, which are commonly used to grow the low defect density metal nitride structures with lateral epitaxy. The substrates once loaded into the growth chamber are not subject to removal from the chamber during any intermediate stage of the complete growth process i.e., during the nucleation of metal nitride at catalyst sites and their preferential lateral growth to form large area metal nitride islands. All material growth occurs directly on the substrate and not over any masking layer as is the case for the known lateral epitaxial overgrowth techniques.

The surfaces 103*a* of the metal nitride islands 103 are very smooth as shown in FIG. 4 and are provided with root mean square (RMS) surface roughness is less than 1 nm.

Figure 3B:
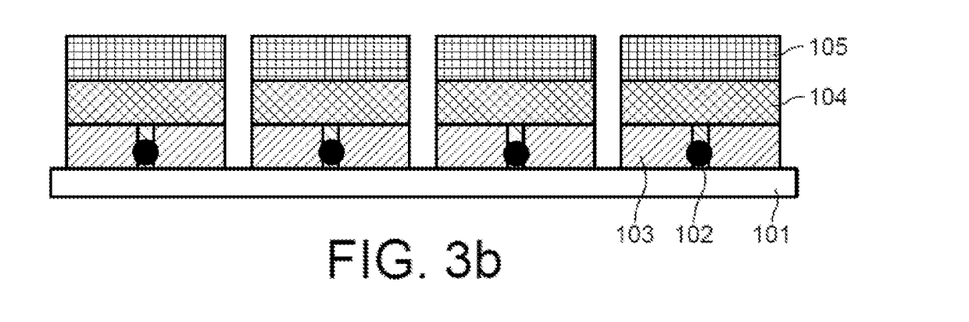
FIG. 3(b) is a schematic cross-sectional view depicting lateral orientation of exemplary gallium nitride islands, grown on a substrate, through an array of catalyst sites, with reduced dislocation density and along with active devices.

In yet another aspect of the present invention, as shown in FIG. 3(*b*), at least an intermediate layer or an epitaxial device layer 104 is arranged on the top surface 103*a* of the metal nitride island 103 where these layers can be selected from one of $Al_xGa_yIn_{1-x-y}N$ where $0 \leq x, y \leq 1$ and typically constitute a multitude of such layers with alternating compositions.

The metal nitride platform 100 with reduced dislocation density can be built on any substrate, which is suitable for III-nitride growth, including obtaining non-polar metal nitride films, which are particularly relevant for constructing opto-electronic device stacks by varying the orientation of the substrate 101.

In the present invention, as an exemplary aspect the orientation of III-nitrides with c-plane polar orientation is obtained. However, it is by changing the orientation of the substrate 101 non-polar oriented templates can be grown, with reduced dislocation density.

In yet another aspect of the present invention, a semiconductor device, which is built on the platform 100 of the present invention, includes a substrate 101. A pre-defined array of catalyst sites 102 are arranged on the substrate 101. Metal nitride islands 103, with variable lateral dimensions, are grown from the catalyst sites 102, where the variable lateral dimensions that are larger than the dimensions of said catalyst sites 102 with reduced dislocation densities at the surface and bending of dislocations at side walls of said metal nitride islands. Electrically and optically-active devices such as high electron mobility transistor devices, quantum well light emitting diodes etc., are arranged on the metal nitride islands either directly or with appropriate intermediate layers 104.

The device(s) can be fabricated on this low defect density platform 100 either directly or after the deposition of further epitaxial layer 104, enabling the realization of both electronic devices (such as high electron mobility transistors) and opto-electronic devices such as LEDs and laser diodes 105, as shown in FIG. 3(b). A further growth of additional epitaxial layers can be performed should there be any such requirement. Exemplary devices 105, which can be built on the platform 100, include high electron mobility transistors and light emitting diodes having alternating layers of metal nitride alloy of aluminum$_x$gallium$_y$indium$_{(1-x-y)}$nitride ($Al_x$-$Ga_y$In$_{1-x-y}$N), where where $_x$ and $_y$ are in the range of 0-1.

Therefore, the metal nitride platform 100 for arranging active devices comprises, the pre-defined array of catalyst sites 102, with intervening distances, disposed on the substrate 101. The large metal nitride islands 103 with lateral to vertical size ratios of at least greater than one (1) are disposed on the array of catalyst sites 102. The surfaces 103a of the metal nitride islands 103 are with reduced dislocation densities and side walls 103b with bending of dislocations.

Figure 8:
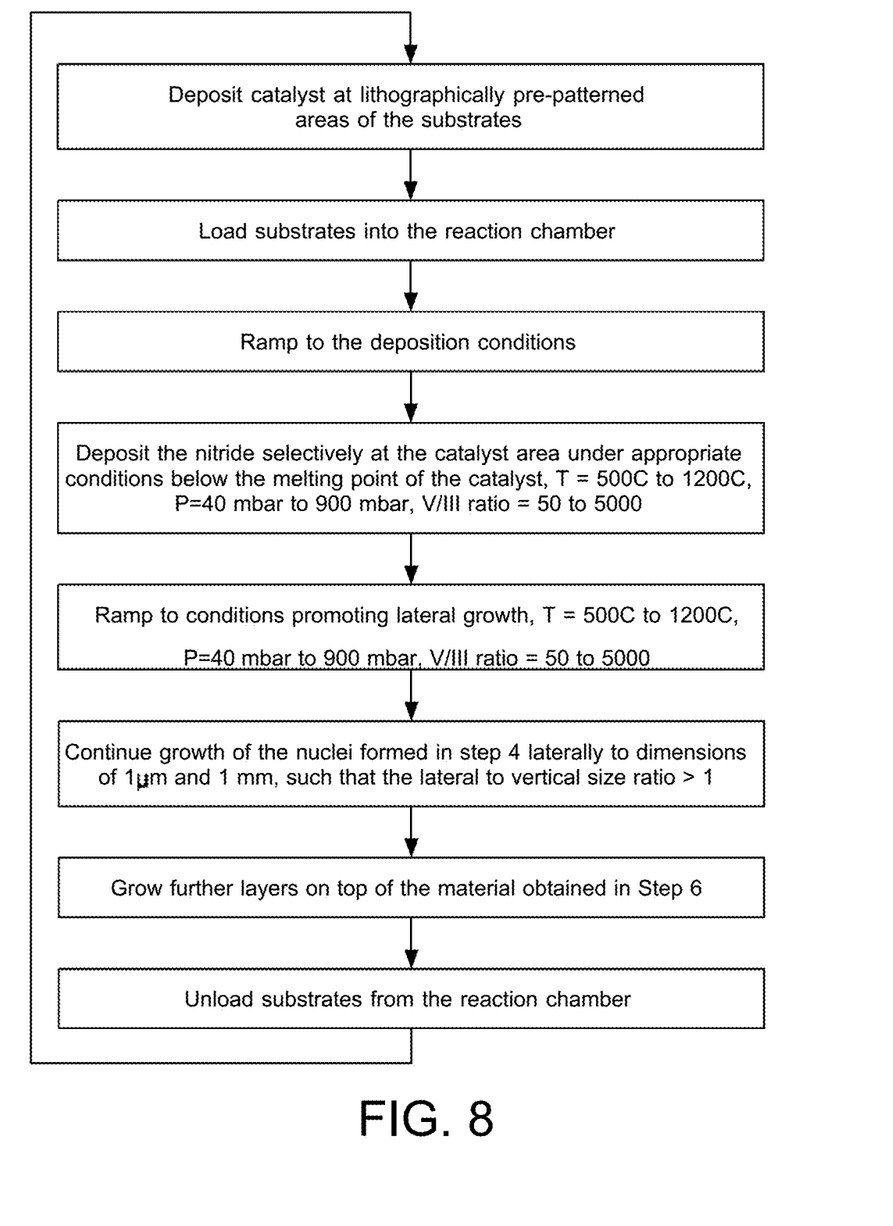
FIG. 8 is a flow drawing indicating the process steps for the preparation of platform of metal nitride islands with lateral orientations and reduced dislocation density.

The present invention also provides a process for a single-step preferential nucleation and growth of a platform of large metal nitride islands with reduced dislocation density is as shown in FIG. 8.

In the process steps of the present invention, initially, the cleaned substrates are deposited with pre-patterned array of catalyst sites, preferably by lithography and the substrates bearing the catalyst sites are loaded into a growth chamber having an environment that is conducive for metal organic chemical vapor deposition (MOCVD), molecular beam epitaxy (MBE), or other any other suitable methods, where the substrates are heated to a high temperatures, where the catalyst sites undergo de-wetting to typically form spherical blobs. In the process steps of the present invention, in an exemplary aspect, MOCVD reaction chamber is used in the presence of precursors such as Al, Ga and In and ammonia for deposition of the metal nitride films or layers.

In yet another aspect of the process steps of the present invention, subsequent to the de-wetting of the catalyst sites, the growth chamber is ramped to the metal nitride growth conditions and the growth of metal nitride islands is performed, by regulating the process parameters, to confine the growth of the metal nitride islands to the catalyst sites and to ensure that no residual growth of metal nitride islands is permitted on the bare areas of the substrate.

In yet another aspect of the process steps of the present invention, growth conditions during the growth of metal nitride islands are maintained or varied to promote lateral growth of the initial seed islands, in order to expand the lateral dimensions of these islands.

In still another aspect of the process steps of the present invention, the size of each of the metal nitride islands thus obtained is in the range of 20 microns and the height of about 5 microns, where size and height of the islands can be suitably increased by a simple expedient of increasing the growth time of the metal nitride islands in the growth chamber.

It is also an aspect of the process steps of the present invention, the defect-free nature of these metal nitride islands is due to the fact that the defects are accommodated primarily at the growth front, whereby, the amount of dislocations that thread through to the top surface, where the active device layers are located, is substantially reduced.

In a further aspect of the process steps of the present invention, the large metal nitride islands are used as templates to initiate growth of further layers and ultimately for the fabrication of active devices.

In the process steps of the present invention for preparation of a metal nitride platform, initially the selected substrate is cleaned and treated to remove impurities such as native oxides and organic and metallic contaminants. Thereafter, a pre-defined array of catalyst sites is deposited on the substrate. The substrate with the array of catalyst islands is transported into a reaction chamber to grow metal nitride islands, selectively, on the array of catalyst sites, in the presence of a reactive gas, which is preferably a mixture of nitrogen and hydrogen. Metal precursors preferably in the form of gallium, aluminum, indium and nitrogen or tri-methyl gallium, tri-methyl aluminum, tri-methyl indium and ammonia, are permitted under preferred reaction conditions, to grow metal nitride islands on the array of catalyst sites. Thereafter, the metal nitride islands are grown with lateral to vertical size ratios of at least greater than one (1), under desired reaction conditions. The preferred reaction conditions for the reaction chamber are temperature in the range of about 500° C. to 1200° C., a pressure in the range of 40-900 mbar and metal organic precursors (V/III ratio) in the range of 50-5000. Metal nitride epitaxial layers, are grown optionally on the metal nitride islands for further arrangement of metal nitride electronic and opto-electronic devices. Alternately, the metal nitride electronic and opto-electronic devices can also be arranged directly on the metal nitride islands.

In an aspect of the process steps of the present invention, the indicated temperature and pressure conditions of the reaction chamber is maintained for the substrates that are deposited with catalyst sites, in the presence of a reactive gas, preferably hydrogen or nitrogen, such that the temperature condition is less than the melting point of the selected catalyst material.

In yet another aspect of the process steps of the present invention, the substrates are held at the indicated temperature and pressure conditions for about 5-180 minutes prior to introduction of the growth precursors.

In yet another aspect of the process steps of the present invention, the metal nitride islands are grown only at the catalyst sites, without any growth or deposition on the bare areas of the substrates, where catalyst sites are not located. For the formation of metal nitride islands, metal-organic growth precursors are introduced into the reaction chamber. In the present invention, the preferred metal-organic precursors are tri-methyl gallium and ammonia is preferred for gallium nitride (GaN) deposition; tri-methyl aluminum and ammonia is preferred for aluminum nitride (AlN) deposition, and tri-methyl indium and ammonia is preferred for indium nitride (InN) deposition. The composition of the metal nitride, for the indicated combinations of AlN, GaN and InN islands, is based on the general formula $Al_xGa_yIn_{1-x-y}N$ where $x0\leq$, $y\leq 1$.

In further aspect of the process steps of the present invention, once the desired lateral growth of the metal nitride islands is obtained, further epitaxial layers, including the active device layers are deposited on the laterally-grown metal nitride islands, by introducing the flow of the desired metal-organic precursors into the reaction chamber.

In the process steps of the present invention, a single-step growth of metal nitride islands is performed without any growth interruptions, such as having to unload samples from the reaction chamber for the deposition of masking layers.

It is understood here that the aforementioned process parameters such as temperature, pressure and V/III ratio are exemplary in nature and will vary depending on the configuration of the reaction chamber. Any suitable variation in the combination of stated process parameters may be used so long as the desired metal nitride islands are obtained preferentially at the catalyst sizes, with lateral sizes larger than the catalyst dimensions, and the lateral to vertical dimensions of the islands greater than 1.

The preferred embodiments of the subject matter of the invention are now described in the form of the following examples, which are exemplary and non-limiting in nature and shall not be construed as limiting the scope of the present invention.

Example 1

Growth of GaN Islands on c-Plane Sapphire Substrates Using Au Catalysts and a Single Set of Process Conditions A two-dimensional array of catalyst sites are first patterned on bare c-plane oriented sapphire substrates using lithography where the catalyst dimension is chosen to be 200 nm×200 nm and the spacing between individual catalyst sites is set to 100 microns. Gold films are formed only over the patterned regions by a lift-off technique. The samples are then loaded into the growth chamber and the temperature is ramped up to 900° C., which is well below the melting point of gold and in a nitrogen ambient. The substrates are maintained at this temperature for 180 minutes, to enable them to completely de-wet. The growth conditions are then ramped to a temperature of 1000° C., a pressure of 150 mbar and in a hydrogen ambient. The growth precursors in the form of ammonia and tri-methyl gallium are introduced, to form islands of c-oriented GaN only over the catalyst sites. The same conditions are maintained to continue the lateral growth of these islands only from the initial array of catalyst sites. The islands with lateral dimensions 20 microns and with vertical dimensions of 5 microns are obtained only over the pre-patterned catalyst sites as illustratively shown in FIG. 1 and FIG. 5. These GaN islands are with a reduced dislocation density of $<10^6$ cm$^{-2}$ at the surface and with a smooth surface having RMS roughness of <1 nm as shown FIG. 4 (SEM image).

Example 2

Growth of GaN Islands on c-Plane Sapphire Substrates Using Ni Catalysts

A two-dimensional array of catalyst sites are first patterned on bare c-plane oriented sapphire substrates using lithography, where the catalyst dimension is chosen to be 200 nm×200 nm and the spacing between individual catalyst sites is set to 100 microns. Nickel films are obtained only over the patterned regions of the catalyst sites, using a lift-off technique. The samples are then loaded into the growth chamber and the temperature is ramped up to 1100° C., which is well below the melting point of nickel and in a nitrogen ambient. The substrates are maintained at temperature for 180 minutes to enable them to completely de-wet. The growth conditions are then ramped to a temperature of 1050° C., a pressure of 150 mbar and in a hydrogen ambient. The growth precursors in the form of ammonia and tri-methyl gallium are introduced, to form islands of c-oriented GaN only over the catalyst sites. The same conditions are maintained to continue the lateral growth of these GaN islands only from the initial array of catalyst sites. The GaN islands are with lateral dimensions of 20 microns and vertical dimensions of 5 microns and the islands are obtained only over the pre-patterned catalyst sites as shown in FIG. 1 and FIG. 5. These islands are with reduced dislocation density of $<10^6$ cm$^{-2}$ at the surface and with a smooth surface having RMS roughness of <1 nm, as shown in FIG. 4.

Example 3

Growth of GaN Islands on c-Plane Sapphire Substrates Using Au Catalysts and a Multiple Set of Process Conditions A two-dimensional array of catalyst sites are first patterned on bare c-plane oriented sapphire substrates using lithography with intended spacings and sizes. Gold films are formed only over the patterned regions using a lift-off technique. The substrates are then loaded into the growth chamber and the temperature is ramped up to 1000° C. which is well below the melting point of gold in a nitrogen ambient. The substrates are maintained at this temperature for 90 minutes to enable their complete de-wetting. The temperature is then ramped to 1020° C., under a pressure of 150 mbar and in a hydrogen ambient. The growth precursors in the form of ammonia and tri-methyl gallium are introduced to form islands of c-oriented GaN only over the array of catalyst sites. The growth temperature is then ramped to 1040° C. to promote lateral growth of GaN islands only from the initial catalyst sites. The GaN islands with lateral dimensions 20 microns and vertical dimensions of 5 microns are obtained only over the pre-patterned catalyst sites as shown in FIG. 1 and FIG. 5. These GaN islands are with dislocation density of $<10^6$ cm$^{-2}$ at the surface and with a smooth surface having RMS roughness of <1 nm, as shown in FIG. 4.

Example 4

Growth of GaN Islands on r-Plane Sapphire Substrates Using Au Catalysts

Figure 2:
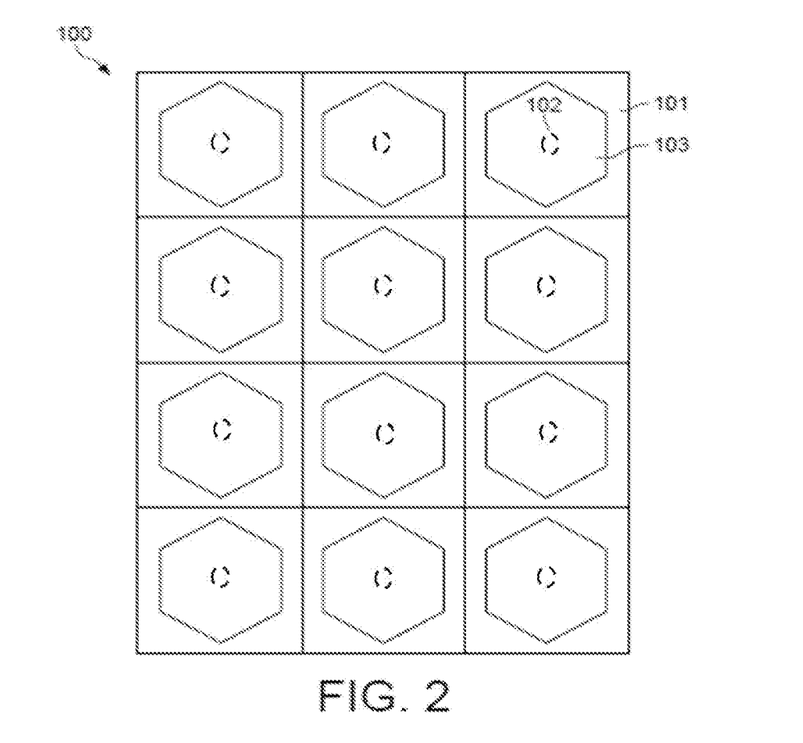
FIG. 2 is a schematic drawing depicting lateral orientation of exemplary gallium nitride islands, grown on a substrate, through an array of catalyst sites with typical sizes less than 1 μm and catalyst site separation distance of more than 1 μm.

A two-dimensional array of catalyst sites are first patterned on bare r-plane oriented sapphire substrates using lithography with the intended sizes and spacings. Gold films are formed only over the patterned regions using a lift-off technique. The substrates are then loaded into the growth chamber and the temperature is ramped up to 1000° C., in a nitrogen ambient. The substrates are maintained at this temperature until they are completely de-wetted. The growth conditions are then ramped to a temperature of 1000° C., a pressure of 150 mbar and in a hydrogen ambient. The growth precursors in the form of ammonia and tri-methyl gallium are introduced, to form islands of non-polar GaN, only over the catalyst sites. The same growth conditions are maintained to continue lateral growth of these non-polar GaN islands only from the initial catalyst sites as schematically illustrated in FIGS. 1, 2 and 3.

Example 5

Growth of High Electron Mobility Transistor Devices on the Reduced Defect Density, Bottom-Up GaN Growth Platform A two-dimensional array of gold catalyst sites are first patterned on bare c-plane oriented sapphire substrates using lithography as described in earlier examples. The substrates are then loaded into the growth chamber and c-plane oriented, reduced defect density GaN islands of large lateral dimensions are obtained only over the pre-patterned catalyst sites as described earlier and as particularly shown in FIGS. 1 and 5. Following this, the growth conditions are ramped to a temperature of 1050° C. and a pressure of 40 mbar. The growth precursors in the form of tri-methyl gallium, tri-methyl aluminium and ammonia are introduced to form a layer of $Al_xGa_{1-x}N$, directly over the GaN layer thus forming a two-dimensional electron gas at this interface constituting a known high electron mobility transistor but deposited on the reduced defect density GaN growth platform.

Example 6

Growth of InGaN Quantum Well Light Emitting Diodes on the Reduced Defect Density, Bottom-Up GaN Growth Platform A two-dimensional array of gold catalyst sites are first patterned on bare c-plane oriented sapphire substrates using lithography as described in earlier examples. The substrates are then loaded into the growth chamber and an array of c-plane oriented and with reduced defect density GaN islands of large lateral dimensions, are obtained only over the pre-patterned catalyst sites as described earlier and shown in FIGS. 1, 4 and 5. Following this, the growth conditions are ramped to a temperature of 700° C., a pressure of 200 mbar and growth precursors in the form of tri-methyl gallium, tri-methyl indium and ammonia are introduced to form a layer of $In_xGa_{1-x}N$ over the GaN layer. This is followed by stopping the flow of the indium precursor to obtain another layer of GaN, sandwiching the $In_xGa_{1-x}N$ film thus forming a quantum well. This process is repeated as required, in order to grow a multi-period quantum well structure that constitutes a light-emitting diode over the reduced defect density growth platform.

The present invention advantageously obtains a single-step growth platform for metal nitride electronic and optoelectronic devices, without any masking layers. The platform of large metal nitride islands is with reduced dislocation density ($<10^6$ cm$^{-2}$), which can be grown on, on a variety of substrates, using a bottom-up process that leads to material savings by using a nucleation assisted epitaxial technique at pre-defined catalyst sites. These defect-free, large-area islands render themselves to conventional planar processing to fabricate semiconductor devices. The process for obtaining such as platform can be advantageously utilized without any growth interruptions or deposition of masking layers, when compared to conventional lateral overgrowth schemes, which leads to lower process complexity and better turn-around times.

It will thus be seen that the embodiments as set forth above, are efficiently attained and since certain changes may be made in carrying out the present invention without departing from the spirit and scope of the invention, it is intended that all matter contained in the above description and shown in the accompanying drawings be interpreted as illustrative and not in a limiting sense.

It is also understood that the following claims are intended to cover all the generic and specific features of the invention herein described and all statements of the scope of the invention, which as a matter of language might be said to fall there-between.

We claim:

1. A metal nitride platform, said metal nitride platform comprising:
    a pre-defined array of catalyst sites, with spatially regular intervening distances, disposed on a substrate, wherein a material for the pre-defined array of catalyst sites is selected from a layered material, preferably graphene, molybdenum disulphide ($MoS_2$) or tungsten disulphide ($WS_2$), or a combination thereof;
    non-coalesced large metal nitride islands, having larger lateral dimensions than that of said pre-defined array of catalyst sites, disposed on said pre-defined array of catalyst sites, wherein a ratio of the lateral dimensions of the metal nitride islands with pre-defined array of catalyst sites is at least greater than one (1); and
    top surfaces of said metal nitride islands are with reduced dislocation densities, such as dislocations that originate from lower portions of said metal nitride islands and growing vertically and encounter side walls of said metal nitride islands undergo lateral deviations, wherein a root mean square (RMS) roughness of the top surfaces of the metal nitride islands is less than 1 nm.

2. The platform as claimed in claim 1, wherein the ratio of larger lateral dimensions is 10:1.

3. The platform as claimed in claim 1, wherein said substrate is either a silicon with a top surface being a (100) crystal plane, a (111) crystal plane, or a (110) crystal plane, or a silicon carbide having (4H), (6H), or (3C) polytype, or a sapphire with a top surface being a c-crystal plane, an r-crystal plane, an a-crystal plane or an m-crystal plane.

4. The platform as claimed in claim 1, where the material for said metal nitride islands is aluminum nitride, gallium nitride, indium nitride or a combination thereof.

5. The platform as claimed in claim 1, wherein the reduced dislocation density at said surface of said metal nitride islands is equal to or less than $10^6$/cm$^{-2}$.

6. A process the preparation a metal nitride platform for active devices, said process comprising the steps of:
    (a) depositing a pre-defined array of catalyst sites with intervening distances, on a substrate, wherein a material for the pre-defined array of catalyst sites is selected from a layered material, preferably graphene, molybdenum disulphide ($MoS_2$) or tungsten disulphide ($WS_2$), or a combination thereof;
    (b) growing metal nitride islands, selectively, only on said pre-defined array of catalyst sites, by placing said substrate in a reaction chamber, in the presence of a reactive gas and precursors and under preferred reaction conditions;
    (c) growing said metal nitride islands with lateral to vertical size ratios of at least greater than one (1), such that top surfaces of said metal nitride islands are with reduced dislocation densities, wherein dislocations that originate from lower portions of said metal nitride islands and growing vertically and encounter side walls of said metal nitride islands undergo lateral deviations, wherein a root mean square (RMS) roughness of the top surfaces of the metal nitride islands is less than 1 nm; and (d) growing, optionally, an epitaxial layer on said metal nitride islands.

7. The process as claimed in claim 6, wherein said reactive gas is a mixture of hydrogen and nitrogen.

8. The process as claimed in claim 7, where said precursors are selected from gallium, aluminum, indium and nitrogen, preferably tri-methyl gallium, tri-methyl aluminum, tri-methyl indium and ammonia.

9. The process as claimed in claim 7, wherein said preferred reaction conditions are temperature in the range of about 500° C. to 1200 C°, pressure in the range of 40-900 mbar and V/III ratio in the range of 50-5000.

10. The process as claimed in claim 7, wherein said lateral to vertical ratios between said large metal nitride islands and said array of catalyst sites are the range of 10:1.

11. The process as claimed in claim 7, wherein said large metal nitride islands are formed without a mask.

12. The process as claimed in claim 7, wherein electrically and optically-active devices, disposed on said metal nitride islands or on said epitaxial layer.

13. The process as claimed in claim 12, wherein said electrically and optically-active devices are formed with a metal nitride alloy of $Aluminum_x$ $Gallium_y$ $Indium_{(1-x-y)}$ Nitride ($Al_xGa_yIn_{(1-x-y)}N$), wherein x and y are in a range of 0-1.

* * * * *